(12) United States Patent
Huang

(10) Patent No.: US 9,876,488 B2
(45) Date of Patent: Jan. 23, 2018

(54) FLIP-FLOP CIRCUIT WITH DATA-DRIVEN CLOCK

(71) Applicant: MediaTek Inc., Hsin-Chu (TW)

(72) Inventor: Rei-Fu Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/250,546

(22) Filed: Aug. 29, 2016

(65) Prior Publication Data
US 2017/0126214 A1 May 4, 2017

Related U.S. Application Data

(60) Provisional application No. 62/249,677, filed on Nov. 2, 2015.

(51) Int. Cl.
*H03K 3/356* (2006.01)
*H03K 3/012* (2006.01)

(52) U.S. Cl.
CPC ......... *H03K 3/35606* (2013.01); *H03K 3/012* (2013.01)

(58) Field of Classification Search
CPC ........................... H03K 3/012; H03K 3/35606
See application file for complete search history.

(56) References Cited

U.S. PATENT DOCUMENTS

| 5,498,988 | A * | 3/1996 | Reyes .................... | H03K 3/012 327/199 |
| 6,204,707 | B1 * | 3/2001 | Hamada ............... | H03K 3/0375 327/202 |
| 6,630,853 | B1 * | 10/2003 | Hamada ................. | H03K 3/012 327/202 |
| 7,631,209 | B2 * | 12/2009 | Schultz .................. | H03K 3/012 326/46 |
| 7,772,905 | B2 * | 8/2010 | Yasuda ................ | H03K 3/0375 327/141 |
| 7,868,677 | B2 * | 1/2011 | Jain ........................ | H03K 3/012 327/202 |
| 8,786,344 | B2 * | 7/2014 | Sailing ................... | H03K 3/012 327/212 |
| 8,860,484 | B2 * | 10/2014 | Pham ..................... | H03K 3/012 327/211 |
| 9,509,285 | B1 * | 11/2016 | Paul ....................... | H03K 3/012 |
| 2004/0036517 | A1 | 2/2004 | Ahn | |

* cited by examiner

*Primary Examiner* — Jeffrey Zweizig
(74) *Attorney, Agent, or Firm* — McClure, Qualey & Rodack, LLP

(57) ABSTRACT

A flip-flop circuit includes a D flip-flop and a gating controller. The D flip-flop generates an output signal according to a data signal and a gated clock signal. The gating controller receives an original clock signal. The gating controller further compares the output signal with the data signal. If the output signal is the same as the data signal, the gating controller will maintain the gated clock signal at a constant logic level. If the output signal is different from the data signal, the gating controller will use the original clock signal as the gated clock signal.

15 Claims, 6 Drawing Sheets

FLIP-FLOP CIRCUIT WITH DATA-DRIVEN CLOCK

CROSS REFERENCE TO RELATED APPLICATIONS

This application claims the benefit of U.S. Provisional Application No. 62/249,677, filed on Nov. 2, 2015, the entirety of which is incorporated by reference herein.

BACKGROUND OF THE INVENTION

Field of the Invention

The disclosure generally relates to a flip-flop circuit, and more specifically, to a flip-flop circuit with a data-driven clock.

Description of the Related Art

A flip-flop is a circuit that has two stable states and can be used to store state information. The flip-flop can be made to change state by signals applied to one or more control inputs and will have one or two outputs. This is the basic storage element in sequential logic.

For example, a D flip-flop is commonly used for a variety of circuits in this art. The D flip-flop captures the value of the D-input at a definite portion of the clock cycle (such as a rising/falling edge of the clock). That captured value becomes the Q output. At other times, the output Q does not change. The D flip-flop can be viewed as a memory cell, a zero-order hold, or a delay line.

However, the main drawback of the D flip-flop is the high power consumption, which is a result of the continuous input clock signal of the D flip-flop. Accordingly, there is a need to design a new flip-flop circuit for solving the problem of the prior art.

BRIEF SUMMARY OF THE INVENTION

In a preferred embodiment, the disclosure is directed to a flip-flop circuit including a D flip-flop and a gating controller. The D flip-flop generates an output signal according to a data signal and a gated clock signal. The gating controller receives an original clock signal. The gating controller further compares the output signal with the data signal. If the output signal is the same as the data signal, the gating controller will maintain the gated clock signal at a constant logic level. If the output signal is different from the data signal, the gating controller will use the original clock signal as the gated clock signal.

In some embodiments, the constant logic level is a high logic level or a low logic level.

In some embodiments, the gating controller includes a comparing circuit and a dual clock-phase latch.

In some embodiments, the comparing circuit includes a first inverter, a first transistor, a second transistor, a third transistor, and a fourth transistor. The first inverter has an input terminal for receiving the data signal, and an output terminal coupled to a first node. The first transistor has a control terminal for receiving the data signal, a first terminal for receiving an inverted output signal, and a second terminal coupled to a second node. The second transistor has a control terminal coupled to the first node, a first terminal for receiving the inverted output signal, and a second terminal coupled to the second node. The third transistor has a control terminal coupled to the first node, a first terminal for receiving the output signal, and a second terminal coupled the second node. The fourth transistor has a control terminal for receiving the data signal, a first terminal for receiving the output signal, and a second terminal coupled to the second node.

In some embodiments, the first transistor and the third transistor are PMOS transistors (P-type Metal Oxide Semiconductor Field Effect Transistors), and the second transistor and the fourth transistor are NMOS transistors (N-type Metal Oxide Semiconductor Field Effect Transistors).

In some embodiments, the dual clock-phase latch includes a second inverter, a third inverter, a fifth transistor, and a sixth transistor. The second inverter has an input terminal for receiving the original clock signal, and an output terminal coupled to a third node. The third inverter has an input terminal coupled to the third node, and an output terminal coupled to a fourth node. The fifth transistor has a control terminal coupled to the fourth node, a first terminal coupled to the second node, and a second terminal coupled to a fifth node. The sixth transistor has a control terminal coupled to the third node, a first terminal coupled to the second node, and a second terminal coupled to the fifth node.

In some embodiments, the fifth transistor is a PMOS transistor, and the sixth transistor is an NMOS transistor.

In some embodiments, the dual clock-phase latch further includes a fourth transistor, a seventh transistor, an eighth transistor, a ninth transistor, and a tenth transistor. The fourth inverter has an input terminal coupled to the fifth node, and an output terminal coupled to a sixth node. The seventh transistor has a control terminal coupled to sixth node, a first terminal coupled to a supply voltage, and a second terminal coupled to a seventh node. The eighth transistor has a control terminal coupled to the third node, a first terminal coupled to the seventh node, and a second terminal coupled to the fifth node. The ninth transistor has a control terminal coupled to the fourth node, a first terminal coupled to the fifth node, and a second terminal coupled to an eighth node. The tenth transistor has a control terminal coupled to the sixth node, a first terminal coupled to the eighth node, and a second terminal coupled to a ground voltage.

In some embodiments, the seventh transistor and the eighth transistor are PMOS transistors, and the ninth transistor and the tenth transistor are NMOS transistors.

In some embodiments, the dual clock-phase latch further includes an eleventh transistor, a twelfth transistor, a thirteenth transistor, a fourteenth transistor, a fifteenth transistor, a sixteenth transistor, and a fifth inverter. The eleventh transistor has a control terminal coupled to the fourth node, a first terminal coupled to the supply voltage, and a second terminal coupled to a ninth node. The twelfth transistor has a control terminal for receiving a test enable signal, a first terminal coupled to the supply voltage, and a second terminal coupled to a tenth node. The thirteenth transistor has a control terminal coupled to the sixth node, a first terminal coupled to the tenth node, and a second terminal coupled to the ninth node. The fourteenth transistor has a control terminal coupled to the fourth node, a first terminal coupled to the ninth node, and a second terminal coupled to an eleventh node. The fifteenth transistor has a control terminal coupled to the sixth node, a first terminal coupled to the eleventh node, and a second terminal coupled to the ground voltage. The sixteenth transistor has a control terminal for receiving the test enable signal, a first terminal coupled to the eleventh node, and a second terminal coupled to the ground voltage. The fifth inverter has an input terminal coupled to the ninth node, and an output terminal for outputting the gated clock signal.

In some embodiments, the eleventh transistor, the twelfth transistor, and the thirteenth transistor are PMOS transistors, and the fourteenth transistor, the fifteenth transistor, and the sixteenth transistor are NMOS transistors.

In some embodiments, the gating controller includes a comparing circuit and a single clock-phase latch.

In some embodiments, the single clock-phase latch includes a fifth transistor, a sixth transistor, a seventh transistor, and an eighth transistor. The fifth transistor has a control terminal coupled to a third node, a first terminal coupled to a supply voltage, and a second terminal coupled to a fourth node. The sixth transistor has a control terminal for receiving the original clock signal, a first terminal coupled to the supply voltage, and a second terminal coupled to a fifth node. The seventh transistor has a control terminal coupled to the second node, a first terminal coupled to the fifth node, and a second terminal coupled to a sixth node. The eighth transistor has a control terminal for receiving a test enable signal, a first terminal coupled to the sixth node, and a second terminal coupled to the fourth node.

In some embodiments, the fifth transistor, the sixth transistor, the seventh transistor, and the eighth transistor are PMOS transistors.

In some embodiments, the single clock-phase latch further includes a ninth transistor, a tenth transistor, an eleventh transistor, and a twelfth transistor. The ninth transistor has a control terminal coupled to the third node, a first terminal coupled to the fourth node, and a second terminal coupled to a seventh node. The tenth transistor has a control terminal coupled to the second node, a first terminal coupled to the seventh node, and a second terminal coupled to a ground voltage. The eleventh transistor has a control terminal for receiving the test enable signal, a first terminal coupled to the seventh node, and a second terminal coupled to the ground voltage. The twelfth transistor has a control terminal for receiving the original clock signal, a first terminal coupled to the seventh node, and a second terminal coupled to the ground voltage.

In some embodiments, the ninth transistor, the tenth transistor, the eleventh transistor, and the twelfth transistor are NMOS transistors.

In some embodiments, the single clock-phase latch further includes a thirteenth transistor, a fourteenth transistor, a fifteenth transistor, a sixteenth transistor, and a second inverter. The thirteenth transistor has a control terminal coupled to the fourth node, a first terminal coupled to the supply voltage, and a second terminal coupled to the third node. The fourteenth transistor has a control terminal for receiving the original clock signal, a first terminal coupled to the supply voltage, and a second terminal coupled to the third node. The fifteenth transistor has a control terminal coupled to the fourth node, a first terminal coupled to the third node, and a second terminal coupled to an eighth node. The sixteenth transistor has a control terminal for receiving the original clock signal, a first terminal coupled to the eighth node, and a second terminal coupled to the ground voltage. The second inverter has an input terminal coupled to the third node, and an output terminal for outputting the gated clock signal.

In some embodiments, the thirteenth transistor and the fourteenth transistor are PMOS transistors, and fifteenth transistor and the sixteenth transistor are NMOS transistors.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are disclosed in detail as follows.

Figure 1:
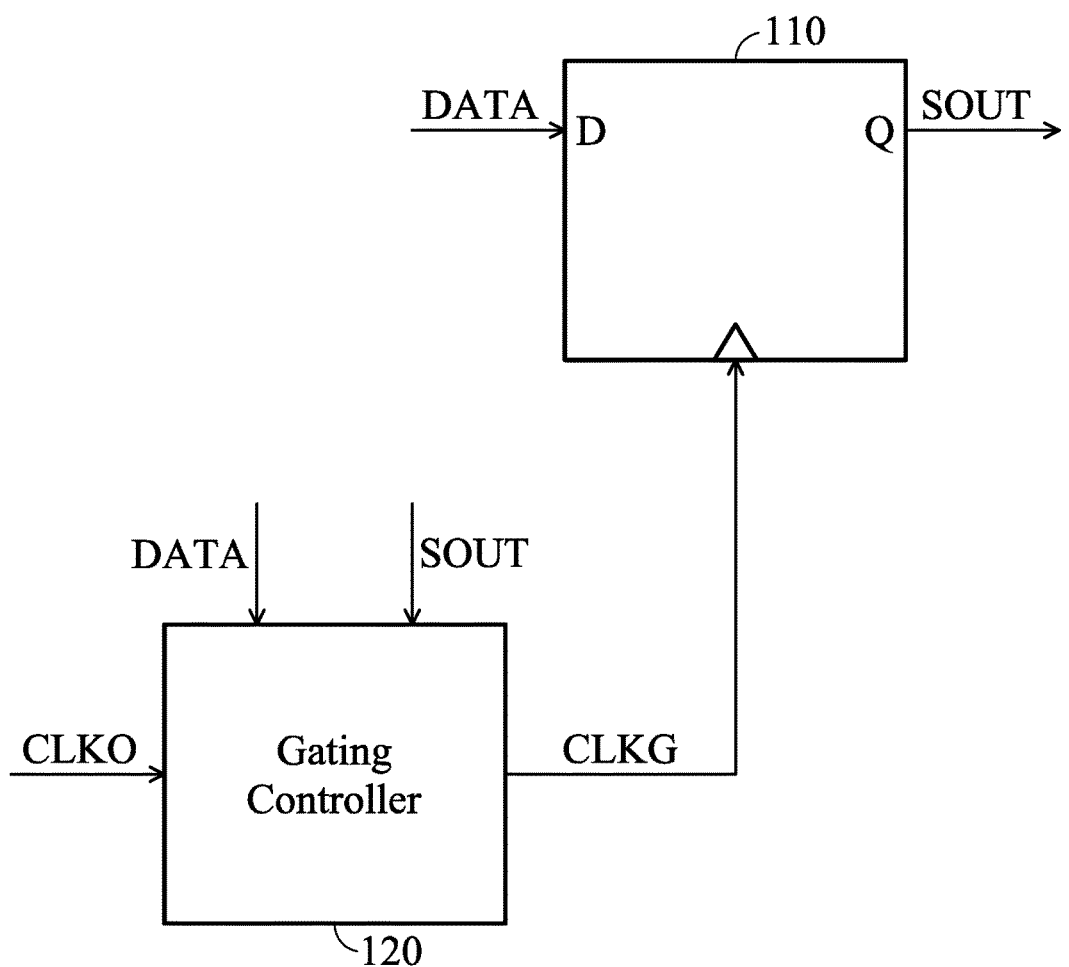
FIG. 1 is a diagram of a flip-flop circuit according to an embodiment of the invention.

FIG. 1 is a diagram of a flip-flop circuit 100 according to an embodiment of the invention. The flip-flop circuit 100 may be applied to low-power integrated circuits in a mobile device, such as a smartphone, a tablet computer, or a notebook computer. As shown in FIG. 1, the flip-flop circuit 100 includes a D flip-flop 110 and a gating controller 120. The D flip-flop 110 generates an output signal SOUT according to a data signal DATA and a gated clock signal CLKG. The gating controller 120 receives an original clock signal CLKO. The original clock signal CLKO may be a continuous clock signal. The gating controller 120 compares the output signal SOUT with the data signal DATA.

If the output signal SOUT is the same as the data signal DATA (e.g., the output signal SOUT has a low logic level and the data signal DATA also has a low logic level, or the output signal SOUT has a high logic level and the data signal DATA also has a high logic level), the gating controller 120 will maintain the gated clock signal CLKG at a constant logic level. For example, the constant logic level may be a high logic level (i.e., a logic level "1") or a low logic level (i.e., a logic level "0"). If the output signal SOUT is different from the data signal DATA (e.g., the output signal SOUT has a low logic level but the data signal DATA has a high logic level, or the output signal SOUT has a high logic level but the data signal DATA has a low logic level), the gating controller 120 will pass the original clock signal CLKO and use it as the gated clock signal CLKG for driving the D flip-flop 110. That is, only when the output signal SOUT from the D flip-flop 110 is going to be changed, the gating controller 120 applies the original clock signal CLKO as the gated clock signal CLKG to the D flip-flop 110. Such a data-driven clock design can effectively reduce the fixed power consumption of the flip-flop circuit 100.

A variety of circuit structures of the flip-flop circuit 100 will be introduced in the following embodiments. These embodiments and figures are just exemplary for the reader to easily understand the invention, and they are not considered as restrictions of the invention.

Figure 2:
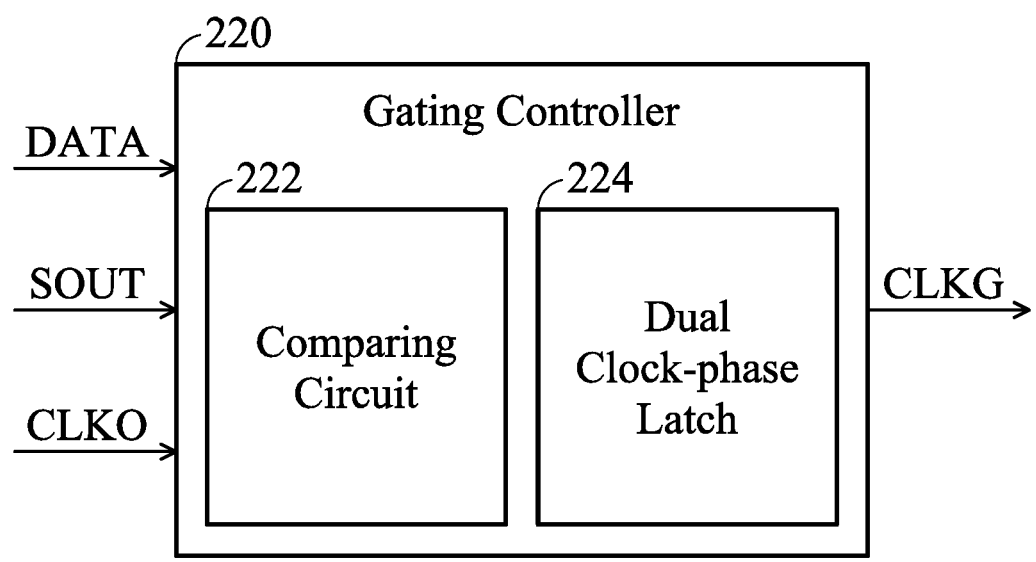
FIG. 2 is a diagram of a gating controller according to an embodiment of the invention.

FIG. 2 is a diagram of a gating controller 220 according to an embodiment of the invention. The gating controller 220 can be applied to the flip-flop circuit 100 of FIG. 1. In the embodiment of FIG. 2, the gating controller 220 includes a comparing circuit 222 and a dual clock-phase latch 224. The comparing circuit 222 and the dual clock-phase latch 224 are configured to selectively generate a gated clock signal CLKG according to a data signal DATA, an output signal SOUT, and an original clock signal CLKO. The comparing circuit 222 can compare the output signal SOUT with the data signal DATA, so as to generate a comparison result. The dual clock-phase latch 224 can process the original clock signal CLKO with both an inverted phase and a non-inverted phase according to the comparison result, and therefore generate the gated clock signal CLKG. The dual clock-phase latch 224 may be classified as an inverted-type latch circuit, which is capable of suppressing the output glitch of the gated clock signal CLKG.

Figure 3:
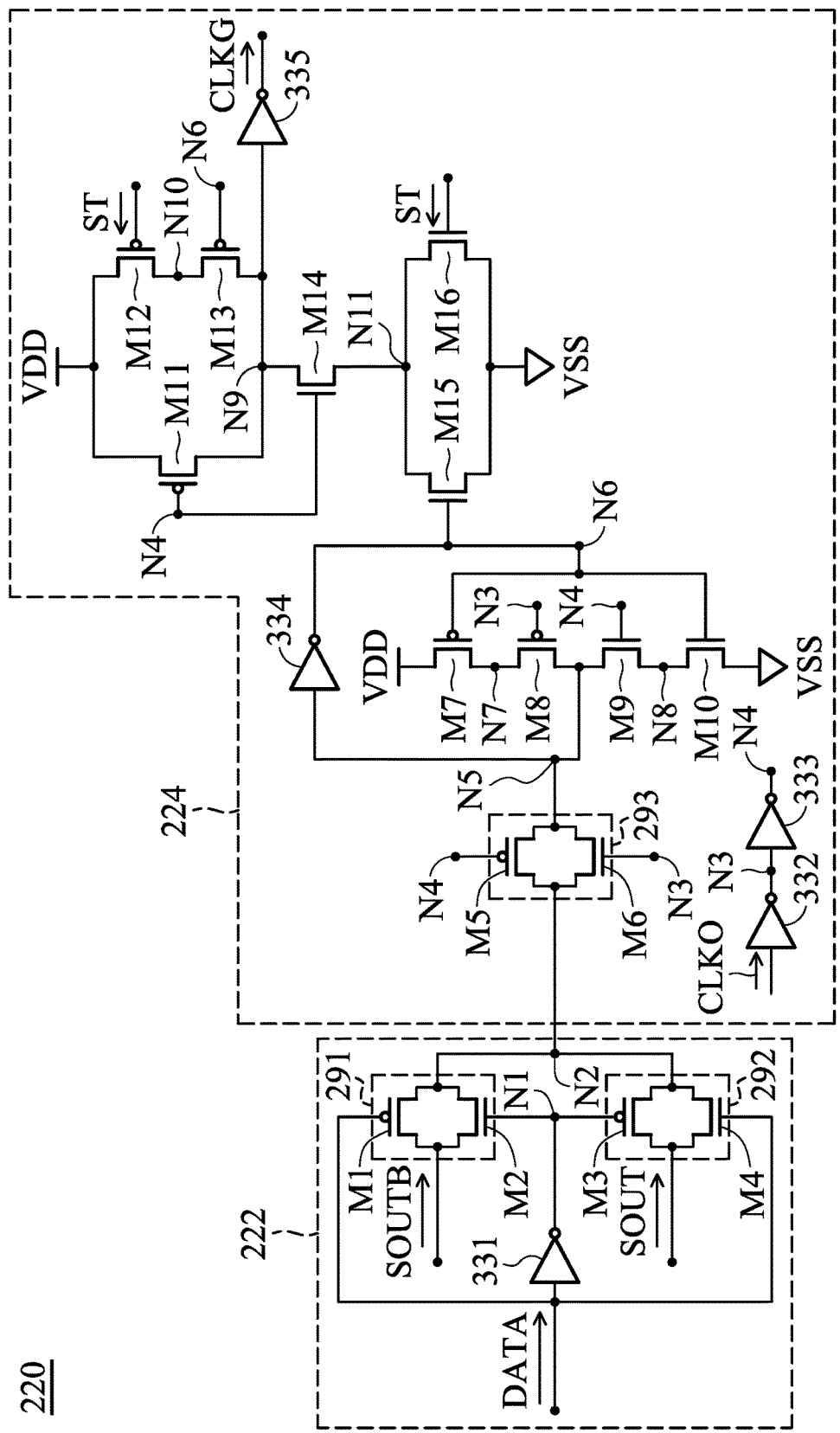
FIG. 3 is a diagram of a detailed circuit structure of a gating controller according to an embodiment of the invention.

FIG. 3 is a diagram of a detailed circuit structure of the gating controller 220 according to an embodiment of the invention. In the embodiment of FIG. 3, the comparing circuit 222 of the gating controller 220 includes a first inverter 331, a first transistor M1, a second transistor M2, a third transistor M3, and a fourth transistor M4. The first transistor M1 and the third transistor M3 may be PMOS transistors (P-type Metal Oxide Semiconductor Field Effect Transistors), and the second transistor M2 and the fourth transistor M4 may be NMOS transistors (N-type Metal Oxide Semiconductor Field Effect Transistors). The first inverter 331 has an input terminal for receiving the data signal DATA, and an output terminal coupled to a first node N1. The first transistor M1 has a control terminal for receiving the data signal DATA, a first terminal for receiving an inverted output signal SOUTB, and a second terminal coupled to a second node N2. The logic level of the inverted output signal SOUTB may be complementary to that of the output signal SOUT. The second transistor M2 has a control terminal coupled to the first node N1, a first terminal for receiving the inverted output signal SOUTB, and a second terminal coupled to the second node N2. A first transmission (pass) gate 291 is formed by the first transistor M1 and the second transistor M2. The first transmission gate 291 selectively passes the inverted output signal SOUTB to the second node N2 according to the voltage at the first node N1. The third transistor M3 has a control terminal coupled to the first node N1, a first terminal for receiving the output signal SOUT, and a second terminal coupled the second node N2. The fourth transistor M4 has a control terminal for receiving the data signal DATA, a first terminal for receiving the output signal SOUT, and a second terminal coupled to the second node N2. A second transmission (pass) gate 292 is formed by the third transistor M3 and the fourth transistor M4. The second transmission gate 292 selectively passes the output signal SOUT to the second node N2 according to the data signal DATA.

In the embodiment of FIG. 3, the dual clock-phase latch 224 of the gating controller 220 at least includes a second inverter 332, a third inverter 333, a fifth transistor M5, and a sixth transistor M6. The fifth transistor M5 may be a PMOS transistor, and the sixth transistor M6 may be an NMOS transistor. The second inverter 332 has an input terminal for receiving the original clock signal CLKO, and an output terminal coupled to a third node N3. The third inverter 333 has an input terminal coupled to the third node N3, and an output terminal coupled to a fourth node N4. The fifth transistor M5 has a control terminal coupled to the fourth node N4, a first terminal coupled to the second node N2, and a second terminal coupled to a fifth node N5. The sixth transistor M6 has a control terminal coupled to the third node N3, a first terminal coupled to the second node N2, and a second terminal coupled to the fifth node N5. A third transmission (pass) gate 293 is formed by the fifth transistor M5 and the sixth transistor M6. The third trans- mission gate 293 selectively passes the voltage at the second node N2 to the fifth node N5 according to the voltage at the third node N3.

In some embodiments, the dual clock-phase latch 224 of the gating controller 220 further includes a fourth inverter 334, a seventh transistor M7, an eighth transistor M8, a ninth transistor M9, and a tenth transistor M10. The seventh transistor M7 and the eighth transistor M8 may be PMOS transistors, and the ninth transistor M9 and the tenth transistor M10 may be NMOS transistors. The fourth inverter 334 has an input terminal coupled to the fifth node N5, and an output terminal coupled to a sixth node N6. The seventh transistor M7 has a control terminal coupled to sixth node N6, a first terminal coupled to a supply voltage VDD, and a second terminal coupled to a seventh node N7. The eighth transistor M8 has a control terminal coupled to the third node N3, a first terminal coupled to the seventh node N7, and a second terminal coupled to the fifth node N5. The ninth transistor M9 has a control terminal coupled to the fourth node N4, a first terminal coupled to the fifth node N5, and a second terminal coupled to an eighth node N8. The tenth transistor M10 has a control terminal coupled to the sixth node N6, a first terminal coupled to the eighth node N8, and a second terminal coupled to a ground voltage VSS.

In some embodiments, the dual clock-phase latch 224 of the gating controller 220 further includes an eleventh transistor M11, a twelfth transistor M12, a thirteenth transistor M13, a fourteenth transistor M14, a fifteenth transistor M15, a sixteenth transistor M16, and a fifth inverter 335. The eleventh transistor M11, the twelfth transistor M12, and the thirteenth transistor M13 may be PMOS transistors, and the fourteenth transistor M14, the fifteenth transistor M15, and the sixteenth transistor M16 may be NMOS transistors. The eleventh transistor M11 has a control terminal coupled to the fourth node N4, a first terminal coupled to the supply voltage VDD, and a second terminal coupled to a ninth node N9. The twelfth transistor M12 has a control terminal for receiving a test enable signal ST, a first terminal coupled to the supply voltage VDD, and a second terminal coupled to a tenth node N10. The thirteenth transistor M13 has a control terminal coupled to the sixth node N6, a first terminal coupled to the tenth node N10, and a second terminal coupled to the ninth node N9. The fourteenth transistor M14 has a control terminal coupled to the fourth node N4, a first terminal coupled to the ninth node N9, and a second terminal coupled to an eleventh node N11. The fifteenth transistor M15 has a control terminal coupled to the sixth node N6, a first terminal coupled to the eleventh node N11, and a second terminal coupled to the ground voltage VSS. The sixteenth transistor M16 has a control terminal for receiving the test enable signal ST, a first terminal coupled to the eleventh node N11, and a second terminal coupled to the ground voltage VSS. The fifth inverter 335 has an input terminal coupled to the ninth node N9, and an output terminal for outputting the gated clock signal CLKG.

The test enable signal ST is arranged for controlling the dual clock-phase latch 224 to enter a normal work mode or a test mode. For example, if the test enable signal ST has a low logic level, the dual clock-phase latch 224 can operate in the normal work mode and the D flip-flop 110 can receive the data signal DATA normally; and if the test enable signal ST has a high logic level, the dual clock-phase latch 224 can operate in the test mode and the D flip-flop 110 can receive a test data signal instead, such that the functions of the flip-flop circuit 100 can be under test. In alternative embodiments, the above design is adjusted, such that the dual clock-phase latch 224 operates in the test mode when the test enable signal ST has a low logic level, and operates in the normal work mode when the test enable signal ST has a high logic level.

According to practical measurements, the flip-flop circuit 100 including the comparing circuit 222 and the dual clock-phase latch 224 of FIG. 3 has 21% less fixed power consumption and just 64% more layout area than a conventional D flip-flop does.

Figure 4:
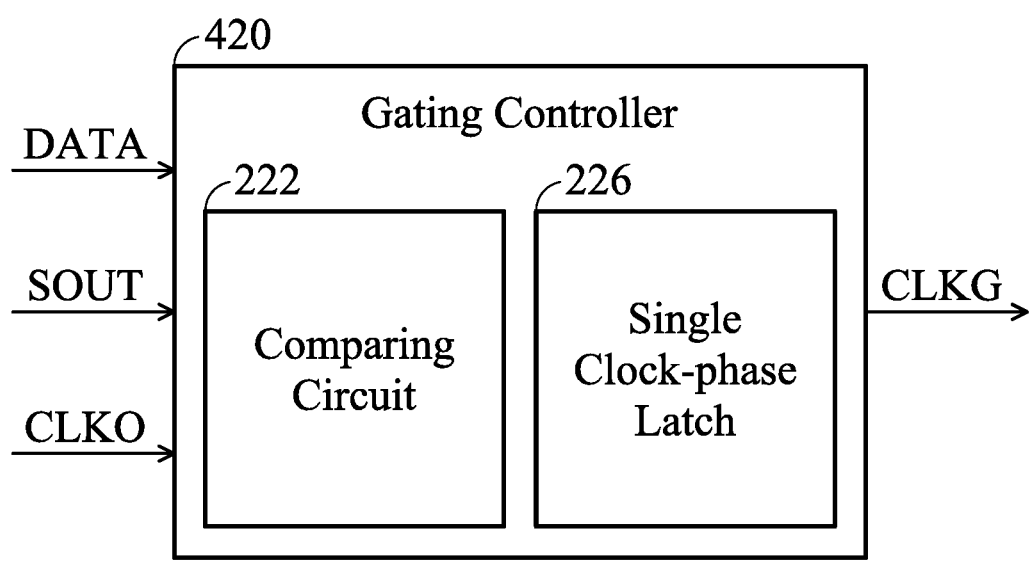
FIG. 4 is a diagram of a gating controller according to an embodiment of the invention.

FIG. 4 is a diagram of a gating controller 420 according to an embodiment of the invention. The gating controller 420 can be applied to the flip-flop circuit 100 of FIG. 1. In the embodiment of FIG. 4, the gating controller 420 includes a comparing circuit 222 and a single clock-phase latch 226. The comparing circuit 222 and the single clock-phase latch 226 are configured to selectively generate a gated clock signal CLKG according to a data signal DATA, an output signal SOUT, and an original clock signal CLKO. The comparing circuit 222 can compare the output signal SOUT with the data signal DATA, so as to generate a comparison result. The single clock-phase latch 226 can process the original clock signal CLKO with only a non-inverted phase according to the comparison result, and therefore generate the gated clock signal CLKG. The single clock-phase latch 226 may be classified as an SR-type (Set-Reset type) latch circuit, which is capable of suppressing the output glitch of the gated clock signal CLKG.

Figure 5:
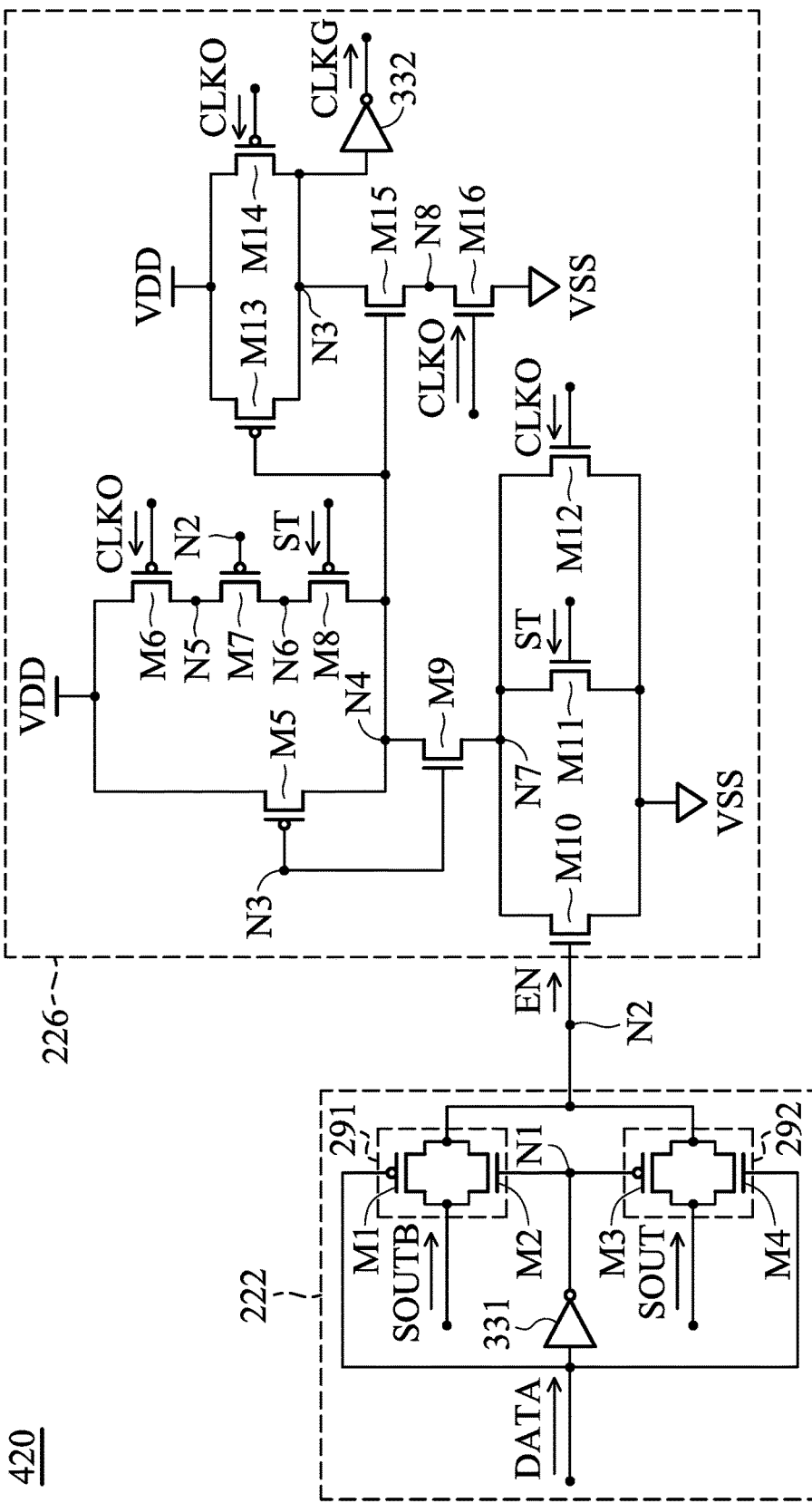
FIG. 5 is a diagram of a detailed circuit structure of a gating controller according to an embodiment of the invention.

FIG. 5 is a diagram of a detailed circuit structure of the gating controller 420 according to an embodiment of the invention. In the embodiment of FIG. 5, the comparing circuit 222 of the gating controller 420 includes a first inverter 331, a first transistor M1, a second transistor M2, a third transistor M3, and a fourth transistor M4. The first transistor M1 and the third transistor M3 may be PMOS transistors (P-type Metal Oxide Semiconductor Field Effect Transistors), and the second transistor M2 and the fourth transistor M4 may be NMOS transistors (N-type Metal Oxide Semiconductor Field Effect Transistors). The first inverter 331 has an input terminal for receiving the data signal DATA, and an output terminal coupled to a first node N1. The first transistor M1 has a control terminal for receiving the data signal DATA, a first terminal for receiving an inverted output signal SOUTB, and a second terminal coupled to a second node N2. The second transistor M2 has a control terminal coupled to the first node N1, a first terminal for receiving the inverted output signal SOUTB, and a second terminal coupled to the second node N2. A first transmission (pass) gate 291 is formed by the first transistor M1 and the second transistor M2. The first transmission gate 291 selectively passes the inverted output signal SOUTB to the second node N2 according to the voltage at the first node N1. The third transistor M3 has a control terminal coupled to the first node N1, a first terminal for receiving the output signal SOUT, and a second terminal coupled the second node N2. The fourth transistor M4 has a control terminal for receiving the data signal DATA, a first terminal for receiving the output signal SOUT, and a second terminal coupled to the second node N2. A second transmission (pass) gate 292 is formed by the third transistor M3 and the fourth transistor M4. The second transmission gate 292 selectively passes the output signal SOUT to the second node N2 according to the data signal DATA.

In the embodiment of FIG. 5, the single clock-phase latch 226 of the gating controller 420 at least includes a fifth transistor M5, a sixth transistor M6, a seventh transistor M7, and an eighth transistor M8. The fifth transistor M5, the sixth transistor M6, the seventh transistor M7, and the eighth transistor M8 may be PMOS transistors. The fifth transistor M5 has a control terminal coupled to a third node N3, a first terminal coupled to a supply voltage VDD, and a second terminal coupled to a fourth node N4. The sixth transistor M6 has a control terminal for receiving the original clock signal CLKO, a first terminal coupled to the supply voltage VDD, and a second terminal coupled to a fifth node N5. The seventh transistor M7 has a control terminal coupled to the second node N2, a first terminal coupled to the fifth node N5, and a second terminal coupled to a sixth node N6. The eighth transistor M8 has a control terminal for receiving a test enable signal ST, a first terminal coupled to the sixth node N6, and a second terminal coupled to the fourth node N4.

In some embodiments, the single clock-phase latch 226 of the gating controller 420 further includes a ninth transistor M9, a tenth transistor M10, an eleventh transistor M11, and a twelfth transistor M12. The ninth transistor M9, the tenth transistor M10, the eleventh transistor M11, and the twelfth transistor M12 may be NMOS transistors. The ninth transistor M9 has a control terminal coupled to the third node N3, a first terminal coupled to the fourth node N4, and a second terminal coupled to a seventh node N7. The tenth transistor M10 has a control terminal coupled to the second node N2, a first terminal coupled to the seventh node N7, and a second terminal coupled to a ground voltage VSS. The eleventh transistor M11 has a control terminal for receiving the test enable signal ST, a first terminal coupled to the seventh node N7, and a second terminal coupled to the ground voltage VSS. The twelfth transistor M12 has a control terminal for receiving the original clock signal CLKO, a first terminal coupled to the seventh node N7, and a second terminal coupled to the ground voltage VSS.

In some embodiments, the single clock-phase latch 226 of the gating controller 420 further includes a thirteenth transistor M13, a fourteenth transistor M14, a fifteenth transistor M15, a sixteenth transistor M16, and a second inverter 332. The thirteenth transistor M13 and the fourteenth transistor M14 may be PMOS transistors, and fifteenth transistor M15 and the sixteenth transistor M16 may be NMOS transistors. The thirteenth transistor M13 has a control terminal coupled to the fourth node N4, a first terminal coupled to the supply voltage VDD, and a second terminal coupled to the third node N3. The fourteenth transistor M14 has a control terminal for receiving the original clock signal CLKO, a first terminal coupled to the supply voltage VDD, and a second terminal coupled to the third node N3. The fifteenth transistor M15 has a control terminal coupled to the fourth node N4, a first terminal coupled to the third node N3, and a second terminal coupled to an eighth node N8. The sixteenth transistor M16 has a control terminal for receiving the original clock signal CLKO, a first terminal coupled to the eighth node N8, and a second terminal coupled to the ground voltage VSS. The second inverter 332 has an input terminal coupled to the third node N3, and an output terminal for outputting the gated clock signal CLKG.

The test enable signal ST is arranged for controlling the single clock-phase latch 226 to enter a normal work mode or a test mode. For example, if the test enable signal ST has a low logic level, the single clock-phase latch 226 can operate in the normal work mode and the D flip-flop 110 can receive the data signal DATA normally; and if the test enable signal ST has a high logic level, the single clock-phase latch 226 can operate in the test mode and the D flip-flop 110 can receive a test data signal instead, such that the functions of the flip-flop circuit 100 can be under test. In alternative embodiments, the above design is adjusted, such that the single clock-phase latch 226 operates in the test mode when the test enable signal ST has a low logic level, and operates in the normal work mode when the test enable signal ST has a high logic level.

According to practical measurements, the flip-flop circuit 100 including the comparing circuit 222 and the single clock-phase latch 226 of FIG. 5 has 92% less fixed power consumption and just 47% more layout area than a conventional D flip-flop does.

Figure 6:
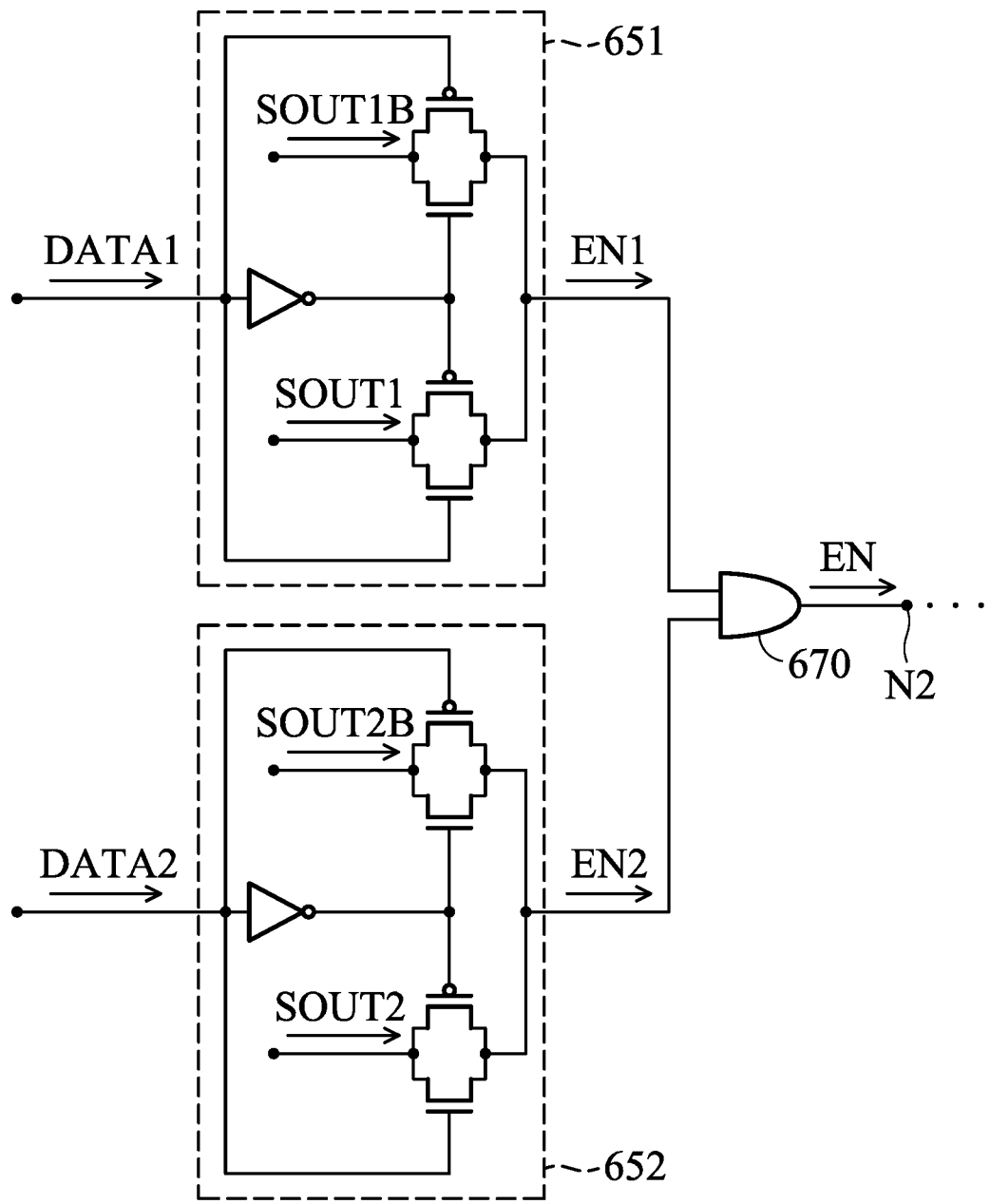
FIG. 6 is a diagram of a partial circuit structure of a gating controller according to an embodiment of the invention.

In some embodiments, the gating controller 420 of FIG. 5 can be applied to two-bit design of D flip-flops. FIG. 6 is a diagram of a partial circuit structure of a gating controller 620 according to an embodiment of the invention. FIG. 6 is similar to FIG. 5. The gating controller 620 may cooperate with two D flip-flops (not shown). A first D flip-flop generates a first output signal SOUT1 and a first inverted output signal SOUT1B according to a first data signal DATA1 and a gated clock signal CLKG. A second D flip-flop generates a second output signal SOUT2 and a second inverted output signal SOUT2B according to a second data signal DATA2 and the gated clock signal CLKG. The gating controller 620 includes a first comparing circuit 651 and a second comparing circuit 652. The first comparing circuit 651 compares the first output signal SOUT1 with the first data signal DATA1, so as to generate a first enable signal EN1. The second comparing circuit 652 compares the second output signal SOUT2 with the second data signal DATA2, so as to generate a second enable signal EN2. The gating controller 620 further includes an AND gate 670 for processing the first enable signal EN1 and the second enable signal EN2. Specifically, the AND gate 670 has a first input terminal for receiving the first enable signal EN1, a second input terminal for receiving the second enable signal EN2, and an output terminal for outputting an integrated enable signal EN. The integrated enable signal EN can be applied to the second node N2 of the single clock-phase latch 226 of FIG. 5, and therefore the single clock-phase latch 226 generates the gated clock signal CLKG for driving both of the first D flip-flop and the second D flip-flop. On the same ground, the gate controller 620 can be used for more-bit design of D flip-flops. Other features of the gating controller 620 of FIG. 6 are similar to those of the gating controller 420 of FIG. 5. Accordingly, the two embodiments can achieve similar levels of performance.

The embodiments of FIG. 3 and FIG. 5 include some components which use the same reference letters or reference numbers. However, it should be understood that the two embodiments are independent of each other, and they do not share any component in their circuit structures. The same reference letters or reference numbers are just arranged for indicating corresponding or similar items. Each reference letter or reference number may have respective meaning in different embodiments of the disclosure.

The invention proposes a novel flip-flop circuit with a data-driven clock. In comparison to the conventional design, the invention has at least the following advantages: (1) reducing the total power consumption, (2) being applicable to more-bit flip-flops, (3) not occupying large area on the chip, and (4) suppressing the output glitch of the gated clock signal. Therefore, the flip-flop circuit of the invention is suitable for application in a variety of low-power mobile communication devices.

The above parameters are just exemplary, rather than limitations of the invention. One of ordinary skill may adjust these settings according to different requirements. It should be understood that the proposed flip-flop circuit is not limited to the configurations of FIGS. 1 to 6. The invention may merely include any one or more features of any one or more embodiments of FIGS. 1 to 6. In other words, not all of the features shown in the figures should be implemented in the proposed flip-flop circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip-flop circuit, comprising:
   a D flip-flop, generating an output signal according to a data signal and a gated clock signal; and
   a gating controller, receiving an original clock signal, and comparing the output signal with the data signal, wherein if the output signal is the same as the data signal, the gating controller maintains the gated clock signal at a constant logic level, and wherein if the output signal is different from the data signal, the gating controller uses the original clock signal as the gated clock signal;
   wherein the gating controller comprises a comparing circuit and a dual clock-phase latch;
   wherein the comparing circuit compares the output signal with the data signal, so as to generate a comparison result;
   wherein the dual clock-phase latch processes the original clock signal with both an inverted phase and a non-inverted phase according to the comparison result, and therefore generates the gated clock signal;
   wherein the dual clock-phase latch is classified as an inverted-type latch circuit, which is capable of suppressing an output glitch of the gated clock signal.

2. The flip-flop circuit as claimed in claim 1, wherein the comparing circuit comprises:
   a first inverter, wherein the first inverter has an input terminal for receiving the data signal, and an output terminal coupled to a first node;
   a first transmission gate, selectively passing an inverted output signal to a second node according to a voltage at the first node; and
   a second transmission gate, selectively passing the output signal to the second node according to the data signal.

3. The flip-flop circuit as claimed in claim 2, wherein the dual clock-phase latch comprises:
   a second inverter, wherein the second inverter has an input terminal for receiving the original clock signal, and an output terminal coupled to a third node;
   a third inverter, wherein the third inverter has an input terminal coupled to the third node, and an output terminal coupled to a fourth node; and
   a third transmission gate, selectively passing a voltage at the second node to a fifth node according to a voltage at the third node.

4. The flip-flop circuit as claimed in claim 3, wherein the dual clock-phase latch further comprises:

a fourth inverter, wherein the fourth inverter has an input terminal coupled to the fifth node, and an output terminal coupled to a sixth node;

a seventh transistor, wherein the seventh transistor has a control terminal coupled to sixth node, a first terminal coupled to a supply voltage, and a second terminal coupled to a seventh node;

an eighth transistor, wherein the eighth transistor has a control terminal coupled to the third node, a first terminal coupled to the seventh node, and a second terminal coupled to the fifth node;

a ninth transistor, wherein the ninth transistor has a control terminal coupled to the fourth node, a first terminal coupled to the fifth node, and a second terminal coupled to an eighth node; and a tenth transistor, wherein the tenth transistor has a control terminal coupled to the sixth node, a first terminal coupled to the eighth node, and a second terminal coupled to a ground voltage.

5. The flip-flop circuit as claimed in claim 4, wherein the seventh transistor and the eighth transistor are PMOS transistors (P-type Metal Oxide Semiconductor Field Effect Transistors), and the ninth transistor and the tenth transistor are NMOS transistors (N-type Metal Oxide Semiconductor Field Effect Transistors).

6. The flip-flop circuit as claimed in claim 4, wherein the dual clock-phase latch further comprises:

an eleventh transistor, wherein the eleventh transistor has a control terminal coupled to the fourth node, a first terminal coupled to the supply voltage, and a second terminal coupled to a ninth node;

a twelfth transistor, wherein the twelfth transistor has a control terminal for receiving a test enable signal, a first terminal coupled to the supply voltage, and a second terminal coupled to a tenth node;

a thirteenth transistor, wherein the thirteenth transistor has a control terminal coupled to the sixth node, a first terminal coupled to the tenth node, and a second terminal coupled to the ninth node;

a fourteenth transistor, wherein the fourteenth transistor has a control terminal coupled to the fourth node, a first terminal coupled to the ninth node, and a second terminal coupled to an eleventh node;

a fifteenth transistor, wherein the fifteenth transistor has a control terminal coupled to the sixth node, a first terminal coupled to the eleventh node, and a second terminal coupled to the ground voltage;

a sixteenth transistor, wherein the sixteenth transistor has a control terminal for receiving the test enable signal, a first terminal coupled to the eleventh node, and a second terminal coupled to the ground voltage; and a fifth inverter, wherein the fifth inverter has an input terminal coupled to the ninth node, and an output terminal for outputting the gated clock signal.

7. The flip-flop circuit as claimed in claim 6, wherein the eleventh transistor, the twelfth transistor, and the thirteenth transistor are PMOS transistors (P-type Metal Oxide Semiconductor Field Effect Transistors), and the fourteenth transistor, the fifteenth transistor, and the sixteenth transistor are NMOS transistors (N-type Metal Oxide Semiconductor Field Effect Transistors).

8. A flip-flop circuit, comprising:

a D flip-flop, generating an output signal according to a data signal and a gated clock signal; and a gating controller, receiving an original clock signal, and comparing the output signal with the data signal, wherein if the output signal is the same as the data signal, the gating controller maintains the gated clock signal at a constant logic level, and wherein if the output signal is different from the data signal, the gating controller uses the original clock signal as the gated clock signal;

wherein the gating controller comprises a comparing circuit and a single clock-phase latch;

wherein the comparing circuit compares the output signal with the data signal, so as to generate a comparison result;

wherein the single clock-phase latch processes the original clock signal with only a non-inverted phase according to the comparison result, and therefore generates the gated clock signal;

wherein the single clock-phase latch is classified as an SR-type (Set-Reset type) latch circuit, which is capable of suppressing an output glitch of the gated clock signal.

9. The flip-flop circuit as claimed in claim 8, wherein the comparing circuit comprises:

a first inverter, wherein the first inverter has an input terminal for receiving the data signal, and an output terminal coupled to a first node;

a first transmission gate, selectively passing an inverted output signal to a second node according to a voltage at the first node; and a second transmission gate, selectively passing the output signal to the second node according to the data signal.

10. The flip-flop circuit as claimed in claim 9, wherein the single clock-phase latch comprises:

a fifth transistor, wherein the fifth transistor has a control terminal coupled to a third node, a first terminal coupled to a supply voltage, and a second terminal coupled to a fourth node;

a sixth transistor, wherein the sixth transistor has a control terminal for receiving the original clock signal, a first terminal coupled to the supply voltage, and a second terminal coupled to a fifth node;

a seventh transistor, wherein the seventh transistor has a control terminal coupled to the second node, a first terminal coupled to the fifth node, and a second terminal coupled to a sixth node; and an eighth transistor, wherein the eighth transistor has a control terminal for receiving a test enable signal, a first terminal coupled to the sixth node, and a second terminal coupled to the fourth node.

11. The flip-flop circuit as claimed in claim 10, wherein the fifth transistor, the sixth transistor, the seventh transistor, and the eighth transistor are PMOS transistors (P-type Metal Oxide Semiconductor Field Effect Transistors).

12. The flip-flop circuit as claimed in claim 10, wherein the single clock-phase latch further comprises:

a ninth transistor, wherein the ninth transistor has a control terminal coupled to the third node, a first terminal coupled to the fourth node, and a second terminal coupled to a seventh node;

a tenth transistor, wherein the tenth transistor has a control terminal coupled to the second node, a first terminal coupled to the seventh node, and a second terminal coupled to a ground voltage;

an eleventh transistor, wherein the eleventh transistor has a control terminal for receiving the test enable signal, a first terminal coupled to the seventh node, and a second terminal coupled to the ground voltage; and a twelfth transistor, wherein the twelfth transistor has a control terminal for receiving the original clock signal, a first terminal coupled to the seventh node, and a second terminal coupled to the ground voltage.

13. The flip-flop circuit as claimed in claim 12, wherein the ninth transistor, the tenth transistor, the eleventh transistor, and the twelfth transistor are NMOS transistors (N-type Metal Oxide Semiconductor Field Effect Transistors).

14. The flip-flop circuit as claimed in claim 12, wherein the single clock-phase latch further comprises:
- a thirteenth transistor, wherein the thirteenth transistor has a control terminal coupled to the fourth node, a first terminal coupled to the supply voltage, and a second terminal coupled to the third node;
- a fourteenth transistor, wherein the fourteenth transistor has a control terminal for receiving the original clock signal, a first terminal coupled to the supply voltage, and a second terminal coupled to the third node;
- a fifteenth transistor, wherein the fifteenth transistor has a control terminal coupled to the fourth node, a first terminal coupled to the third node, and a second terminal coupled to an eighth node;
- a sixteenth transistor, wherein the sixteenth transistor has a control terminal for receiving the original clock signal, a first terminal coupled to the eighth node, and a second terminal coupled to the ground voltage; and
- a second inverter, wherein the second inverter has an input terminal coupled to the third node, and an output terminal for outputting the gated clock signal.

15. The flip-flop circuit as claimed in claim 14, wherein the thirteenth transistor and the fourteenth transistor are PMOS transistors (P-type Metal Oxide Semiconductor Field Effect Transistors), and fifteenth transistor and the sixteenth transistor are NMOS transistors (N-type Metal Oxide Semiconductor Field Effect Transistors).

* * * * *